United States Patent [19]

Brust et al.

[11] Patent Number: 4,677,351
[45] Date of Patent: Jun. 30, 1987

[54] CIRCUIT FOR PREVENTING BURN-IN SPOTS ON THE PICTURE SCREEN OF A VISUAL DISPLAY

[75] Inventors: Hans-Detlef Brust, Dudweiler; Johann Otto, Bad Toelz, both of Fed. Rep. of Germany

[73] Assignee: Siemens Aktiengesellschaft, Berlin and Munich, Fed. Rep. of Germany

[21] Appl. No.: 746,509

[22] Filed: Jun. 19, 1985

[30] Foreign Application Priority Data

Jul. 25, 1984 [DE] Fed. Rep. of Germany ....... 3427455

[51] Int. Cl.⁴ ............................................ H01J 29/52
[52] U.S. Cl. ................................. 315/386; 358/220; 250/397
[58] Field of Search ................ 315/386, 381; 358/220; 250/397

[56] References Cited

U.S. PATENT DOCUMENTS 3,963,961 6/1976 Ray et al. ........................... 315/381
4,180,738 12/1979 Smith et al. ................. 250/396 ML
4,480,220 10/1984 Isakozawa et al. ................. 250/397

FOREIGN PATENT DOCUMENTS 2832068 1/1980 Fed. Rep. of Germany ...... 315/386

OTHER PUBLICATIONS

"Raster-Elektronmikroskopie", L. Reimer U. G. Pfefferkorn Springer-Verlag, Berlin 1973-pp. 1–3.

Primary Examiner—Theodore M. Blum
Attorney, Agent, or Firm—Hill, Van Santen, Steadman & Simpson

[57] ABSTRACT

A circuit for preventing burn-in spots on the picture screen 23 of a visual display 2 comprising an electron beam 19 that is intensity modulated and positioned controlled by way of a deflection system 21, 22 as, for example, for a scanning electron microscope. The protection to prevent burn-in spots utilizes a circuit wherein the signal input 24 of at least one deflection system 21 is electrically connected to a differentiator which produces an output that is connected to the first input of a comparator which also receives a reference voltage and the comparator output is switched to the input of a retriggable trigger circuit so as to control the intensity of the electron beam 19 and thus prevent burn-in on the picture screen.

17 Claims, 3 Drawing Figures

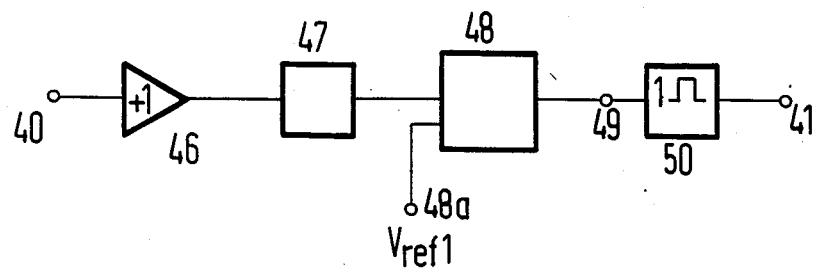
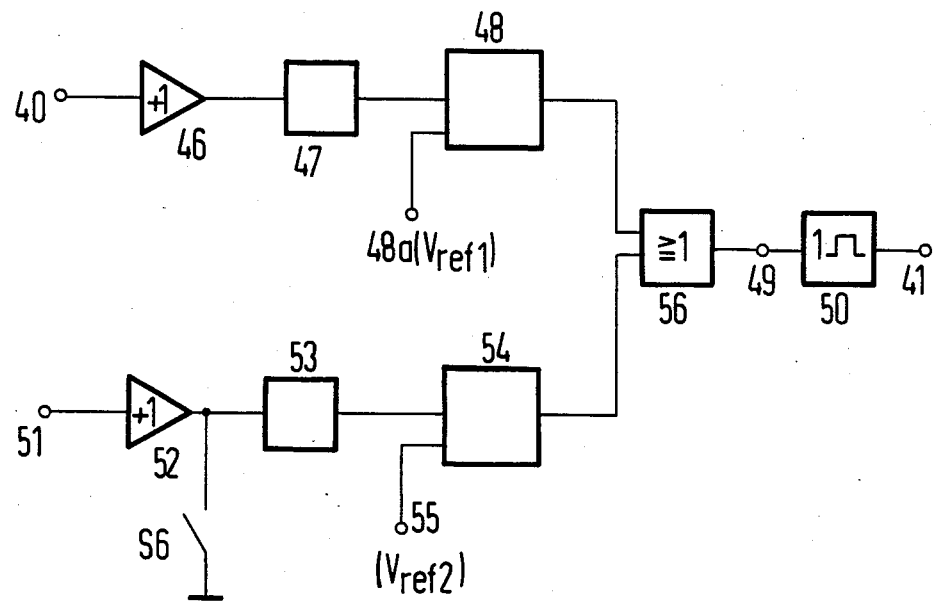

4,677,351

CIRCUIT FOR PREVENTING BURN-IN SPOTS ON THE PICTURE SCREEN OF A VISUAL DISPLAY

BACKGROUND OF THE INVENTION

1. Field of the Invention

This invention relates in general to a protective circuit for preventing burn-in spots on the picture screen of a display device.

2. Description of the Prior Art

A normal circuit arrangement is provided in the scanning electron microscope identified as the Cambridge Stereoscan model S150. When the electron beam in this apparatus is positioned by means of an external drive of the deflection system in the spot mode then this circuit causes an additional deflection of the electron beam in the visual display along a small circle. This prevents a picture element selected over a longer time span from being destroyed or damaged due to receiving too high a dosage of energy. The intensity control of the electron beam by luminosity information received from the microscope column is cancelled in this mode and is replaced by an adjustment of the visual display to a constant luminosity of the circle which is being produced. With such system, the visual presentation of a specimen which is being investigated with the scanning electron microscope is not possible on the picture screen in the spot mode.

SUMMARY OF THE INVENTION

It is an object of the present invention to provide a simple circuit for preventing burn-in spots on a picture screen of a visual display which enables operation of the visual display with slow beam deflection and consequently high dwell time of the electron beam with respect to the individual picture elements without suppressing the intensity control of the electron beam in the visual display which depends on the supplied luminosity information. In the invention, the signal input of at least one deflection system is electrically connected to a differentiator and the output of the differentiator is connected to a comparator which receives a second input comprising a reference voltage and the output of the comparator is switched to the input of a retriggerable one shot multivibrator which supplies an output to the control input and a control unit which influences the intensity control of the electron beam.

The advantages obtainable with the invention are that with slow deflection rates or, respectively, high dwell times of the electron beam in the visual display such as occur, for example, in the computer controlled reproduction of specimens, the image acquired by means of a scanning electron microscope and electronically stored cannot cause burn-in spots in the luminescent layer of the picture tube.

Thus it is an object of the present invention to provide an improved control system for a visual display which prevents the electron beam from burning spots in the cathode ray tube luminescent layer.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 2 comprises a block diagram of a first embodiment of the invention; and

FIG. 3 illustrates a block diagram of a second embodiment of the invention.

DESCRIPTION OF THE PREFERRED EMBODIMENTS

Figure 1:
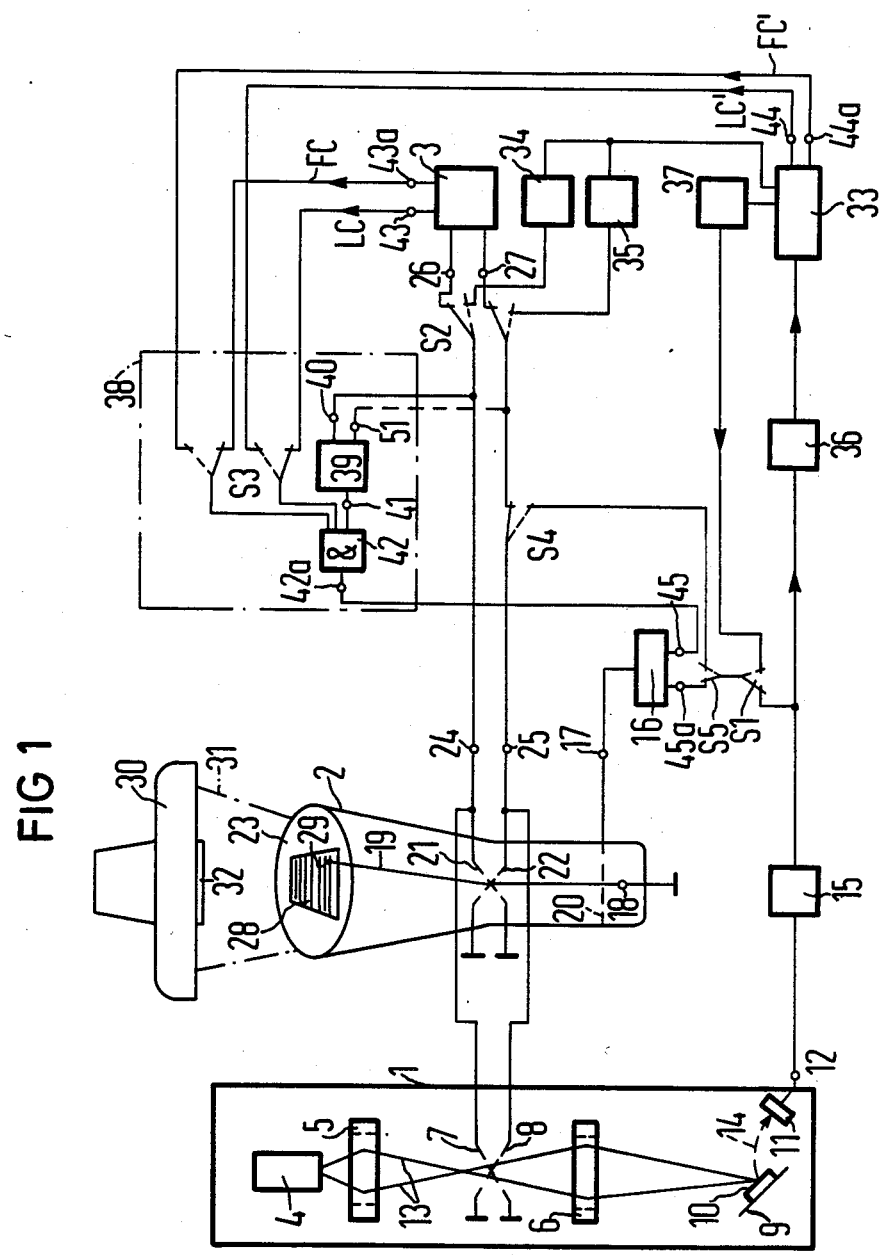
FIG. 1 is an electrical schematic circuit diagram of a scanning electron microscope incorporating a circuit of the invention.

FIG. 1 illustrates a scanning electron microscope which has a microscope column 1 and which is connected to a picture tube 2. A scan generator 3 essentially forms the visual display system. The microscope column 1 contains an electron gun 4 as well as two focusing coils 5 and 6 which function as magnetic lenses. The column 1 also includes two magnetic deflection systems 7 and 8 and a specimen mount 9. A specimen 10 is secured to the mount 9 and a detector 11 produces an output at a terminal 12. The electron gun comprises a cathode, a Wehnelt cylinder and an anode such as described, for example, in the book "Raster-Elektronenmikroskopie" by L. Reimer and G. Pfefferkorn, printed at Springer-Verlag Berlin, 1973, pages 1 through 3 and FIG. 1.1. An electron beam generated by the electron gun 4 and focused by the coils 5 and 6 is deflected by the deflection system 7 and 8 such that it sweeps the specimen 10 in a line grid pattern. While it is directed to a specific point of the specimen surface, the electrons impinge thereon and trigger an emission of secondary electrons 14 which are supplied through an electrical field to the detector 11 and produce a corresponding signal at the output 12. In an alternative method, the output 12 can also be of a nature such that some other arbitrary useful signal can be taken therefrom and this signal arises in the microscope column 1, for example, by means of backscattered electrons or from specimen currents.

The signal occurring at output 12 is supplied through a signal amplifier 15 and switches S1 and S5 to a control unit 16 and then to the intensity control input 17 of the picture tube 2. The picture tube 2 contains a cathode 18, an intensity control electrode 20 which might, for example, be a Wehnelt cylinder connected to the control input 17. The picture tube includes two deflection systems 21 and 22 which influence the electron beam and has a picture screen 23. The deflection systems 7 and 21 are connected in parallel to each other so that they respectively cause deflection of the electron beam 13 and the electron beam 19 in the x-direction. The deflection systems 7 and 21 are connected to a common terminal 24. The deflection systems 8 and 22 are also connected in parallel to each other and cause respective deflection of the beams 13 and 19 in the y-direction and they are connected to a common terminal 25. The deflection systems are electrically connected single poled to reference potentials.

When the scan generator 3 supplies a line frequency sawtooth deflection voltage to the terminal 24 through its output 26 and a switch S2 and supplies a frame-frequency sawtooth deflection voltage to the terminal 25 by way of its output 27 and the switch S2 as well as switch S4 such that the frame frequency is lower than the line frequency by a factor corresponding to the number of lines, then the specimen's surface will be swept in a grid-like fashion by the electron beam 13 and an area 28 on the picture screen 23 is swept in a grid-like fashion by the electron beam 19 in synchronization therewith. Since a characteristic signal is generated from every individual point of the specimen surface and appears at the output 12, the signal effecting intensity control of the electron beam 19 by way of the input 17 and the image of the picture element, for example 29 on the picture screen 23 respectively corresponds to the point under consideration and receives a corresponding luminosity in the picture element respectively corresponding to such point. An image of the specimen surface therefore results within the area 28 on the picture screen 23. Such image 28 can be recorded by a photographic camera 30 and a screen 31 can expediently be mounted between the picture screen 23 and camera optics 32 so as to suppress extraneous light.

The signals obtained from the specimen surface which appear at the output 12 can also be electronically stored. For this purpose, a computer 33 is connected by the switch S2 in broken line position and assumes the sequential selection of the individual points on the surface of the specimen 10 and the corresponding points of the picture screen 23 instead of the scan generator 3. Individual groups of memory locations which are respectively composed of three subgroups are successively addressed by way of the routing circuits of the computer 33. In the addressing of such a group, a first digital position signal is produced from its output subgroup to a digital to analog converter 34 which converts such signal into a first deflection voltage which is applied through switch S2 to terminal 24 and adjust the electron beams 13 and 19 to a first coordinate in the x-deflection direction. At the same time, a second digital position signal is produced from the second subgroup to a digital to analog converter 35 which converts this signal into a second deflection voltage which is communicated to the terminal 25 through switches S2 and S4 such that the electron beams 13 and 19 are set to a second coordinate in the y-deflection direction. A signal appearing at terminal 12 is obtained in the above-described fashion from the point of the specimen surface under consideration and this signal is supplied by way of the signal amplifier 15 and an analog to digital converter 36 to the computer 33 as illuminosity information signal and is stored in the third subgroup of the memory location under consideration. The operation is repeated for every point of the specimen surface which is under investigation and is of interest and in particular the specimen may be swept in a line like grid whereby the image of the specimen surface is stored in a plurality of memory location groups which plurality corresponds to the plurality of picture elements. When the switch S1 is in the solid line position, the image electronically stored in this fashion is simulataneously displayed on the picture screen 23.

For reproducing an image of the specimen surface electronically stored in the computer 33 on the picture screen 23, the switch S1 is moved to its broken line position and the switch S2 remains in its broken line position. When a sequential addressing of the groups of the memory locations allocated to the individual picture elements in the sequence of the line raster occurs, the digital luminosity information stored in the third subgroup is then output for each picture element 29 set by the position signals of the respectively first two subgroups and is converted into an analog luminosity signal in the digital to analog converter 37 and is supplied by way of switch S1 and the control unit 16 to the intensity control 17. The electronically stored image is output by way of the picture screen 23 in this manner. The electron beam 13 is shutoff and thus will not produce burning of the screen.

Both the position control of the electron beam 19 which occurs with the computer 33 as well as the position control of the electron beam 19 which is initiated with the scan generator 3, the electron beam 19 can be directed to a picture element 29 for a time so long that the associated location of the luminescent layer of the picture screen is destroyed or damaged as a consequence of absorbing too high an energy level. So as to avoid such undesired result, a circuit arrangement 38 which includes a subcircuit 39 which receives a first input 40 and has an output 41 is provided. The input 40 is connected to the terminal 24 and the output 41 is connected to the first input of a logic circuit 42 which in a particular example may be an AND gate as illustrated in FIG. 1. A second input of 42 is optionally connected through a switch S3 to an output 43 of the scan generator 3 or to an output 44 of the computer 33 and a third input of the logic circuit 42 is optionally connected through switch S3 to an output 43a of the scan generator 3 or to an output 44a of the computer 33. The output of the logic circuit 42 is supplied to a control input 45 of the control unit 16.

FIG. 2 illustrates in detail the circuit 39. The input 40 is electrically connected through an amplifier stage 46 which has a low output impedance and may be a voltage follower to the input of a differentiator 47 which produces an output which is connected to the first input of a comparator 48. The second input 48a of the comparator is supplied a reference voltage $V_{ref1}$. The output of the comparator 48 is electrically connected to the input of a retriggerable one shot multivibrator 50 which produces an output which is supplied to the terminal 41 and provides the output of circuit 39.

In the upper or solid line position of switch S2 a line frequency sawtooth deflection voltage generated by the scan generator 3 which appears at the terminal 24 is supplied through the input 40 to the differentiator 47 and is differentiated therein. The output level of the differentiator 47 is compared to the reference voltage $V_{ref1}$ in the comparator 48. When it exceeds $V_{ref1}$ then a trigger signal occurs at the output of the comparator 48 and this trigger signal triggers the one shot multivibrator 50 when it is in a stable condition or respectively retriggers it when it is in a non-stable condition. When the multivibrator 50 is triggered, it emits a control signal which is in turn shut off after the time span characteristic of the multivibrator 50 and such time can also be adjustable. When the one shot multivibrator 50 is in its non-stable condition during the appearance of a trigger signal, then in this non-stable condition it continues to be maintained after the appearance of the trigger signal for the duration of such time span. Only thereafter is the control signal of the trigger element 50 shut off.

In the case of a position control of the electron beam 19 and under given conditions beam 13 by the scan generator 3 the switch S3 will be in the position shown with solid lines. A signal LC can be removed at the output 43 as long as the amplitude of the x-deflection voltage does not exceed a prescribed value which corresponds to the x-deflection from the last picture element of every line, in other words, corresponds to the line end. When this value is exceeded, than the signal LC is disconnected. Also, the scan generator 3 outputs a signal FC by way of the output 43a as long as the amplitude of the y-deflection voltage output through the output 27 does not exceed a prescribed value which corresponds to the y-deflection for the lowest line of the raster, in other words, the lower image edge. When the electron beam 39 crosses beyond the lower image edge, then the signal FC is disconnected.

When the electron beam 19 moves across the picture screen in the x-deflection direction faster than a minimum deflection speed which is determined by $V_{ref1}$ then the comparator 48 supplies a continuous trigger signal for the trigger element 50 and the trigger element 50 is constantly held in its non-stable condition and emits a control signal at the output 41 which with the simultaneous appearance of signals LC and FC is communicated to the output 42a of the logic circuit 42. This control signal influences the control unit 16 through its control input 45 such that a signal occurring at the input 45a is connected through to the intensity control input 17. When on the other hand, the minimum deflection speed of the electron beam 19 is not reached, then the control signal at point 41 and thus at the control input 45 also is disconnected and the through connection of a signal occurring at the input 45a to the input 17 of the picture tube is interrupted in the control unit 16. The amount of the reference voltage $V_{ref1}$ and thus the minimum deflection speed is selected to be so low that the absorbed energy does not exceed a permitted value for each of the picture elements swept by the electron beam 19. On the other hand, the voltage $V_{ref1}$ is selected to be high enough such that the noise voltages coupled in at the input 40 do not result in a trigger signal at the output of the comparator 48 and thus indicate a beam deflection which is in fact not present. As soon as the electron beam 19 passes beyond the end of a line, LC at the output 43 is disconnected and the result is that the control signal at point 42a disappears so that the control unit 16 interupts the signal path between 45a and 17 corresponding to the invisible horizontal flyback of the electron beam. When on the other hand the electron beam passes beyond the lower image edge, FC at the output 43 is disconnected and this also leads to the production of a control signal output through the logic circuit which is disconnected and the signal path is interrupted during the invisible return of the electron beam at the image end.

The method of operation of the circuit arrangement 38 described above also applies in that case wherein the scan generator 3 emits deflection voltages having a step-shaped curve instead of those having a sawtooth curve. Deflection voltages of this type are generated, for example, in a digital manner by way of a clock counter which is followed by a low pass filter. In these instances, the voltage skips between the individual step stages and effect a sequence of trigger signals at the output comparator 48 which results in a constant retriggering of the trigger element 50 which corresponds to the previously described continuous trigger signal.

The circuit arrangement 38 also functions as described above as a position control of the electron beam 19 and under given conditions the electron beam 13 by means of the computer 33, in other words, in the position of the switches S2 and S3 shown in broken line. Deflection voltages are produced as outputs by the analog to digital converters 34 and 35 and particularly have a step-shaped curve when the area 28 and the specimen surface are swept with a line raster. The signals LC and FC are replaced by equivalent signals LC' and FC' which occur at the outputs 44 and 44a of the computer 33. LC' is thereby produced as an output through the output 44 as long as the electron beam 19 does not pass beyond the lower image edge. LC' or, respectively FC' are disconnected when the end of the line or the image edge occurs and this respectively causes the logic circuit 42 to interrupt a control signal which exists at the output 41 so that the input 45 is disconnected from a control signal which normally exists and the signal path between 45a and 17 is interrupted in the control unit 16 during blanking of the electron beam 19. In the spot mode also in which a succession of individual isolated picture elements 29 are selected, the voltage discontinuities when switching to the respectively following picture element cause a triggering of the trigger element 50. If there is too long a dwell time of the electron beam on a certain picture element, the signal path in the control unit 16 is interrupted in the manner described above so as to prevent spot burn-in phenomena on the luminescent layer of the picture screen 23.

FIG. 3 illustrates another embodiment for the circuit 39 and comprises a modification of the circuit of FIG. 2 and expands the circuit of FIG. 2 such that the y-deflection voltages also contribute to the triggerring of the trigger element 50. The individual circuit parts that have been explained relative to FIG. 2 are also incorporated in FIG. 3 and will not be described a second time. Additionally, a second input 51 connected to the terminal 25 is provided and the input 51 is applied through an amplifier 52 with low output impedance which may be a voltage follower to a differentiator 53 which has its output electrically connected to the first input of a comparator 54. A second input 55 of the comparator 54 is supplied with a comparison voltage $V_{ref2}$ which is supplied to terminal 55. The ouptuts of the comparators 48 and 54 are electrically connected to the inputs of an OR element 56 which produces an output connected to the input 49 of the retriggerable one shot multivibrator 50. A circuit arrangement 38 specifically designed according to FIGS. 1 and 3, causes triggering of the trigger element 50 not only when the x-deflection voltage adjacent to the terminal 24 has discontinuity or experiences a sufficiently rapid change, but also when this occurs for the y-deflection voltage adjacent to the terminal 25. It is required for this purpose that the differentiating element 53 differentiate the y-deflection voltage and emit a signal level to the first input of the comparator that is higher than $V_{ref2}$. Whenever one of the outputs of 48 or 54 emit a trigger signal then triggerring or, respectively, retriggering of the trigger element 50 occurs. As a consequence a blanking is also avoided when the electron beam 19 is deflected across the picture screen 23 only in the vertical direction but with sufficient speed. The voltage $V_{ref2}$ is expediently selected to be so low that a signal level which just exceeds $V_{ref2}$ yields a minimal deflection speed in the y-direction which can still be tolerated and whereas the spot burn-in phenomena is reliably avoided and whereas the voltage $V_{ref2}$ must on the other hand have a high enough value not to simulate a movement of the electron beam which is not actually occurring due to noise voltages which are coupled via the input 51.

The prior description is based on the fact that the switches S4 and S5 illustrated in FIG. 1 are always in the solid line positions illustrated in FIG. 1. When the switches S4 and S5 are moved to their broken line positions than an operating mode referred to as "slot scan" occurs wherein the electron beam 19 is deflected along a line on the picture screen 23 by means of the x-deflection voltage supplied to terminal 24 which is supplied by the scan generator 3 or the computer 33 depending on the position of switch S2. Additionally, the electron beam 19 is deflected in the y-direction by signal supplied through the signal amplifier 15 or the digital to analog converter 37 depending on the position of switch S1 such that the degree of its vertical deviation from the described line represents a measure for the signal supplied via amplifier 15 or digital to analog converter 37. In this fashion, the amplitude curve of such a signal can be displayed on the picture screen in the form of a curve as would be the case, for example, in an electron beam oscillscope. The input 45a of the control unit 16 is thereby supplied with a constant voltage which causes a constant trace unblanking of the electron beam 19. In this operating mode, the circuit 39 must be designed either in accordance with that illustrated in FIG. 2 or when formed as illustrated in FIG. 3 a suppression of the circuit branch including the amplifier 52 the differentiator 53 and the comparator 54 must be suppressed and this expediently can be done by closing a switch S6 which applies to the input of the differentiator 53 a reference potential.

By omitting the microscope 1 and the electron gun 4 and other parts of the microscope 1 including the amplifier 15, a universally useable visual display which is equipped with a circuit arrangement 38 of the invention results. When the switches S4 and S5 are replaced by pemanently connected lines which correspond to the solid line positions of the switches illustrated, then the input 45a can be supplied with a signal to control the intensity of the electron beam 19 whereby the electron beam sweeps the picture element 23 in the form of a line raster. The controlling signal can thereby be externally supplied in the solid line position of switch S1 and can be taken from the memory of the computer 33 in the broken line position of switch S1. Another version of such universally employable visual display occurs with reference to FIG. 1 if the components 1 and 4 through 15 are replaced and the switches S4 and S5 are permanently connected by lines which correspond to the switch positions illustrated in broken line. The input 45a is then fixed with a fixed voltage which trace unblanks the electron beam 19 and whereas a signal is supplied to switch S2 which additionally deflects the electron beam in the y-direction for the purpose of a curve display and the electron beam otherwise being only deflected in the x-direction by means of the scan generator 3 or the computer 33. Such signals can also be externally supplied or removed from the memory of the computer 33. The digital to analog converter 35 would be admitted in this version of the apparatus.

Although the invention has been described with respect to preferred embodiments, it is not to be so limited as changes and modifications can be made which are within the full intended scope of the invention as defined by the appended claims.

We claim as our invention:

1. A circuit arrangement for prevention of an spot burn-in phenomena on a picture screen (23) of a visual display (2,3) which has an electron beam (19) that is intensity-controlled by an intensity control and position-controlled by two deflection systems (21, 22), particularly for a scanning electron microscope, comprising a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19).

2. A circuit arrangement according to claim 1, wherein the signal inputs (24, 25) of said two deflection systems (21, 22) influencing the electron beam (19) are electrically connected to said first differentiator (47) and to a second differentiator (53) and to said first comparator (48) and a second comparator (54) whose second inputs (48a, 55) respectively receive first and second reference voltages, and an OR gate (56) connected to the outputs of said first and second comparators (48, 55) and the output of said OR gate connected to the input (49) of said retriggerble one-shot multivibrator (50).

3. A circuit arrangement according to claim 1 or 2, characterizing a logic circuit (42) connected to the output (41) of said one-shot multivibrator (50), said logic circuit connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16).

4. A circuit arrangement for prevention of a spot burn-in phenomena on a picture screen (23) of a visual display (2,3) which has an electron beam (19) that is intensity-controlled by an intensity control and position-controlled by two deflection systems (21, 22), particularly for a scanning electron microscope, comprising a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19), characterizing a logic circuit (42) connected to the output (41) of said one-shot multivibrator (50), said logic circuit connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16), wherein the logic circuit (42) has a third input which receives a second signal (CF, FC') which indicates the alignment of the electron beam (19) to the area (28) of the picture screen (23) to be swept by said electron beam; and said logic circuit (42) transmits the output signal of said one-shot multivibrator (50) to the control input (45) of said control unit (16) as a function of the occurrance of first and second indicating signals (LC, LC', FC, FC').

5. A circuit arrangement according to claim 3 wherein a scan generator 3 is connected to the second input of said logic circuit (42), and said scan generator (3) produces an output which is the first indicating signal (LC), said scan generator generating at least one deflecting voltage for the drive of at least one deflection system of said visual display; and a third input of said logic circuit (42) connected to an output (43a) of said scan generator (3) which outputs the second indicating signal (FC).

6. A circuit arrangement for prevention of a spot burn-in phenomena on a picture screen (23) of a visual display (2, 3) which has an electron beam (19) that is intensity-controlled by an intensity control and position-controlled by two deflection systems (21,22), particularly for a scanning electron microscope, comprising a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19), characterizing a logic circuit (42) connected to the output (41) of said one-shot multivibrator (50), said logic circuit connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16), wherein a computer (33) supplies the second input of said logic circuit (42), said computer (33) producing outputs which are the first indicating signal (LC'), said computer emitting at least one deflecting voltage for the drive of at least one deflection system of the visual display e.g. via a digital-to-analog converter (34), and under certain conditions, the third input of said logic circuit connected to an output (44a) of the computer (33) which outputs the second indicating signal (FC').

7. A circuit arrangement for prevention of a spot burn-in phenomena on a picture screen (23) of a visual display (2, 3) which has an electron beam (19) that is intensity-controlled by an intensity control and position-controlled by two deflection systems (21, 22), particularly for a scanning electron microscope, comprising a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19), characterizing a logic circuit (42) connected to the output (41) of said one-shot multivibrator (50), said logic circuit connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16), wherein a scan generator 3 is connected to the second input of said logic circuit (42), and said scan generator (3) produces an output which is the first indicating signal (LC), said scan generator generating at least one deflecting voltage for the drive of at least one deflection system of said visual display; and a third input of said logic circuit (42) connected to an output (43a) of said scan generator (3) which outputs the second indicating signal (FC), and characterized in that the second input of the logic circuit (42) is connected through a switch (S3) to the outputs (43, 44) of said scan generator (3) and said computer (33) which supply the first indicating signal (LC, LC'), and under certain conditions, the third input of the logic circuit (42) is connected through a switch (S3) to those outputs (43a, 44a) of the scan generator (3) and of the computer (33) which output the second indicating signal (FC, FC').

8. A circuit arrangement according to claim 3, characterized in that the logic circuit (42) is designed as an AND element.

9. A circuit arrangement according to claim 1, characterized in a control unit (16) receives a signal input (45a) which is a signal for the intensity control of the electron beam (19) and the output of the control unit (16) is supplied to the intensity control input (17) of the visual display, and a signal path between the signal input (45a) and the output of the control unit (16) is switched on depending on the occurrence of a control signal at the control input (45) of said control unit.

10. A circuit arrangement according to claim 1 characterized in that the signal serving for the intensity control of the electron beam (19) is taken at the detector output (12) of a scanning electron microscope (1).

11. A circuit arrangement according to claim 1 characterized in that the signal serving for the intensity control of the electron beam (19) is output by a digital-to-analog converter (37) by a computer (33) for controlling the position of the electron beam (19).

12. A circuit arrangement according to claim 1 characterized in that a deflection system (21) conducting the electron beam (19) across the picture screen (23) in a first direction receives a deflecting voltage; and a second deflection system (22) acting in a second direction receives a signal whose shape is to be displayed dependent on the respective deflection of the electron beam (19) on the picture screen (23) in the first direction, whereby the connection between the signal input (25) of the second deflection system (22) and a following differentiator (53) is interrupted.

13. A circuit arrangement according to claim 12, characterized in that the signal whose shape is to be displayed on the picture screen dependent on the respective deflection of the electron beam in the first direction is taken at the output (12) of the microscope column of a scanning electron microscope (1).

14. A circuit arrangement according to claim 12, characterized in that the signal whose shape is to be displayed on the picture screen dependent on the respective deflection of the electron beam in the first direction is output via a digital-to-analog converter (37) by a computer (33), which controls the position of the electron beam.

15. A circuit arrangement for prevention of a spot burn-in phenomena on a picture screen (23) of a visual display (2,3) which has an electron beam (19) that is intensity-controlled by an intensity control and position-controlled by two deflection systems (21, 22), particularly for a scanning electron microscope, comprising a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19), wherein the signal inputs (24, 25) of said two deflection systems (21, 22) influencing the electron beam (19) are electrically connected to said first differentiator (47) and to a second differentiator (53) and to said first comparator (48) and a second comparator (54) whose second inputs (48a, 55) respectively receive first and second reference voltages, and an OR gate (56) connected to the outputs of said first and second comparators (48, 55) and the output of said OR gate connected to the input (49) of said retriggerable one-shot multivibrator (50), characterizing a logic circuit (42) connected to the output (41) of said one-shot multivibrator (50), said logic circuti connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16), and wherein the logic circuit (42) has a third input which receives a second signal (CF, FC') which indicates the alignment of the electron beam (19) to the area (28) of the picture screen (23) to be swept by said electron beam; and said logic circuit (42) transmits the output signal of said one-shot multivibrator (50) to the control input (45) of said control unit (16) as a function of the occurrence of first and second indicating signals (LC, LC', FC, FC').

16. A circuit arrangement for prevention of a spot burn-in phenomena on a picture screen (23) of a visual display (2, 3) which has an electron beam (19) that is intensity-controlled by an intensity control and position-controlled by two deflection systems ,21, 22), particularly for a scanning electron microscope, comprising a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19), wherein the signal inputs (24, 25) of said two deflection systems (21, 22) influencing the electron beam (19) are electrically connected to said first differentiator (47) and to a second differentiator (53) and to said first comparator (48) and a second comparator (54) whose second inputs (48a, 55) respectively receive first and second reference voltages, and an OR gate (56) connected to the outputs of said first and second comparators (48, 55) and the output of said OR gate connected to the input (49) of said retriggerable one-shot multivibrator (50), characterizing a logic circuit (42) connected to the output (41) of said one-shot multivibrator (50), said logic circuit connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16), and wherein a computer (33) supplies the second input of said logic circuit (42), said computer (33) producing outputs which are the first indicating signal (LC'), said computer emitting at least one deflecting voltage for the drive of at least one deflection system of the visual display e.g. via a digital-to-analog converter (34), and under certain conditions, the third input of said logic circuit connected to an output (44a) of the computer (33) which outputs the second indicating signal (FC').

17. A circuit arrangement for prevention of a spot burn-in phenomena on a picture screen (23) of a visual display (2,3) which has an electron beam (19) that is intensity-controlled by an intensity control and position-controlled by two deflection systems (21, 22), particularly for a scanning electron microscope, comprisign a first differentiator (47) electrically connected to the signal input (24) of at least one deflection system (21), a first comparator (48) with a first input connected to the output of said differentiator (47), a second input (48a) of said comparator receiving a reference voltage, a retriggerable one-shot multivibrator (50) connected to the output of said comparator (48), and a control unit (16) connected to the output (41) of said one shot multivibrator so as to influence the intensity control of the electron beam (19), wherein the signal inputs (24, 25) of said two deflection systems (21, 22) influencing the electron beam (19) are electrically connected to said first differentiator (47) and to a second differentiator (53) and to said first comparator (48) and a second comparator (54) whose second inputs (48a, 55) respectively receive first and second reference voltages, and an OR gate (56) connected to the outputs of said first and second comparators (48, 55) and the output of said OR gate connected to the input (49) of said retriggerable one-shot multivibrator (50), characterizing a logic circuit (42) connected to the output (41) of said one-shot multivibrator (50), said logic circuit connected with its output to the control input (45) of said control unit (16), said logic circuit (42) receives a second input which comprises a first signal (LC, LC') which indicates the alignment of the electron beam (19) relative to the area (28) of the picture screen (23) to be swept by said electron beam; and said logic circuit (42) sends the output signal of said one-shot multivibrator (50) to the control input (45) of said control unit (16), wherein a scan generator 3 is connected to the second input of said logic circuit (42), and said scan generator (3) produces an output which is the first indicating signal (LC), said scan generator generating at least one deflecting voltage for the drive of at least one deflection system of said visual display; and a third input of said logic cicuit (42) connected to an output (43a) of said scan generator (3) which outputs the second indicating signal (FC), and characterized in that the second input of the logic circuit (42) is connected through a switch (S3) to the outputs (43, 44) of said scan generator (3) and said computer (33) which supply the first indicating signal (LC, LC''), and under certain conditions, the third input of the logic circuit (42) is connected through a switch (S3) to those outputs (43a, 44a) of the scan generator (3) and of the computer (33) which output the second indicating signal (FC, FC').

* * * * *